United States Patent [19]

Meyer

[11] Patent Number: 5,099,157
[45] Date of Patent: Mar. 24, 1992

[54] MASTER/SLAVE CIRCUIT EMPLOYING TRIACS

[75] Inventor: Gary D. Meyer, Wakesha, Wis.

[73] Assignee: Milwaukee Electric Tool Corporation, Brookfield, Wis.

[21] Appl. No.: 414,590

[22] Filed: Sep. 26, 1989

Related U.S. Application Data

[63] Continuation of Ser. No. 204,890, Jun. 10, 1988, abandoned.

[51] Int. Cl.[5] .......................................... H03K 17/725
[52] U.S. Cl. .................................... 307/632; 307/12; 307/38; 307/155; 307/328
[58] Field of Search ............... 307/631, 632, 638, 645, 307/11, 12, 38, 140, 155, 328

[56] References Cited

U.S. PATENT DOCUMENTS

| | | | |
|---|---|---|---|
| 3,517,217 | 6/1970 | Sleater et al. | 307/632 |
| 3,566,198 | 2/1971 | Delahunty | 307/632 |
| 3,603,817 | 9/1971 | Casson | 307/632 |
| 3,740,585 | 6/1973 | Squiers | 307/632 |
| 3,781,604 | 12/1973 | Scarpino | 307/632 |

Primary Examiner—John Zazworsky
Attorney, Agent, or Firm—Michael, Best & Friedrich

[57] ABSTRACT

The master/slave circuit has a power supply with two conductors. One conductor is connected to one side of both a master outlet and a slave outlet. The other conductor is connected to the main terminal 1 (MR1) of the Triacs Q1, Q2 respectively associated with the receptacles. The other side of the master receptacle is connected to the main terminal 2 of the associated Triac Q1, and to the gate of Q1, through a resistor and to the gate of Q2 through a second resistor. The other side of the slave outlet is connected to MT2 of Q2. When a tool or device plugged into the master outlet is switched on and off a device plugged into the slave will turn on and off with the master and will have the same character (speed control, Soft Start, etc.). An optional switch between the slave outlet and the second resistor connected to the gate of Q2 allows operation of the device plugged into the slave outlet without operating the master.

1 Claim, 1 Drawing Sheet

MASTER/SLAVE CIRCUIT EMPLOYING TRIACS

This application is a continuation of application Ser. No. 07/204,890 filed June 10, 1988, and abandoned in favor of this application.

BACKGROUND OF THE INVENTION

Master/slave circuits are not new and have been provided in terminal boxes into which the master can be plugged along with slave units so that the slaves are energized when the master is energized. These circuits have been quite sophisticated and, consequently, quite expensive, but the expense was justified since they were largely used in connection with some very sophisticated, costly equipment such as computers.

The object of this invention is to provide a low-cost master/slave circuit enabling use in conjunction with power tools in particular, although being suitable for a number of other uses as well.

SUMMARY OF THE INVENTION

This invention provides a master/slave circuit having receptacles into which the master and slave devices can be plugged. The circuit incorporates a Triac for each receptacle. The Triac connected to the master senses the current flow through the device connected to the master receptacle (or outlet). A resistor is connected in the trigger circuit of the Triac to cause the Triac to conduct in precisely in the same manner in which power is supplied to the device connected to the master outlet. The current is also supplied to the gate of a Triac in circuit with the slave outlet. As a result, a device plugged into the slave outlet will turn on and off exactly as the device plugged into the master outlet.

This control senses the power characteristics of the device plugged into the master as the device is operated and provides the same power characteristics to the slave. If the slave uses more power it will receive more power but the characteristics (on-off, phase, etc.) will be the same.

The foregoing arrangement provides advantage in plugging a shop vacuum into the slave outlet so that every time a dust/chip producing tool is turned on, the vacuum is turned on to clean up the debris as it is being generated. As soon as the tool connected to the master outlet is deenergized, the vacuum is shut off and the noise need not be tolerated longer than necessary.

Any of the following power tools can be plugged into the master outlet while a vacuum cleaner is connected to the slave outlet to clean up the mess: routers, belt sanders, radial arm saw, table saw, bench grinders, orbital sanders, shapers, planers and milling machines.

This circuit would also permit controlling cutting fluid or coolant pumps used in conjunction with power tools.

This arrangement can also be used as an electrical interlock preventing a device connected to the slave outlet from being turned on and off unless the master device is turned on first.

A large power load can be connected to the slave outlet and a small power device connected to the master outlet whereby the device, in effect, operates as a switch and amplifier. In this connection, a low-power, inexpensive dimmer can be plugged into the master outlet and this in turn could cause the slave outlet to control a large lighting load or a motor load plugged into the slave outlet.

Other uses will come to mind readily. The circuit according to this invention can also be incorporated into a vacuum cleaner, for example, so as to provide for plugging the vacuum cleaner into a wall receptacle while a power tool is connected to a master outlet on the vacuum cleaner. When the power tool is now energized, the vacuum cleaner will be energized. The regular on/off switch for the vacuum cleaner can also be utilized to operate the vacuum cleaner independently of the power tool plugged into the master outlet on the vacuum cleaner.

This circuit has an interesting and useful feature. Since the Triac will follow the master current, it will then precisely control the slave by way of supplying the same current characteristics to the slave. For example, if there is a Slow-Start circuit in the tool plugged into the master to guard against overload on starting, the slow power increase to the master power tool will be reflected in the motor circuit of the vacuum cleaner so it too will have a slow start characteristic. Similarly, if there is a speed control in the master, it will also control the speed of the vacuum cleaner motor. This also means that if the master is a low-power dimmer switch, it can now control a very substantial load at the slave. This way a lower power dimmer switch can be made to do the job of a much higher power rated switch.

The gate of each Triac is connected to one side of the master outlet through a resistor. The simplified circuit diagram shows a by-pass switch in dotted lines. This permits energizing the device connected to the slave receptacle without energizing the tool connected to the master. This can be useful in situations where additional clean-up with a vacuum cleaner is desired; after sawing, for example.

DETAILED DESCRIPTION OF THE DRAWINGS

Figure 1:
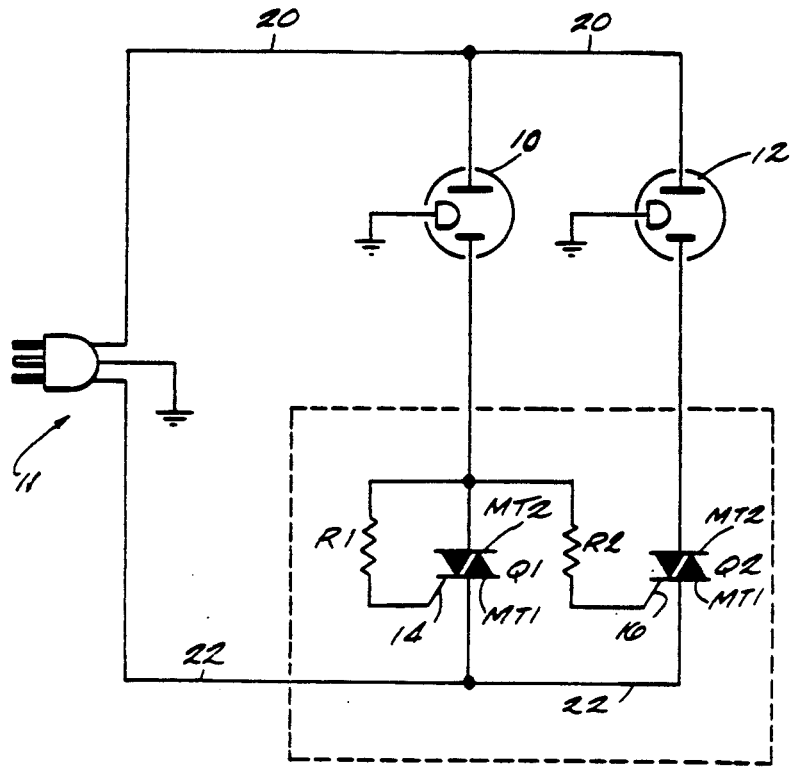
FIG. 1 is a simplified circuit diagram.

The apparatus and components shown in the drawing can be housed in a junction box type arrangement provided with a power cord having a plug 11 which plugs into a standard 120 V 15A (or more) outlet. The box could plug directly into the wall outlet. Two receptacles 10 and 12 are provided. Receptacle 10 is the master and receptacle 12 is the slave. One lead 20 from plug 11 is connected to one side of both master 10 and slave 12. The other lead 22 connects to main terminal one (MT1) of both Triacs Q1 & Q2 and main terminal two (MT2) of the Triacs Q1, and Q2 is connected to the associated receptacle 10, 12 respectively. The circuit incorporates a Triac for each receptacle. Triac Q1, connected to master 10 senses the current flow through the device connected to the master receptacle. Resistor R1 is connected between one side of master 10 and the gate 14 of the Triac Q1 to cause Triac Q1 to conduct precisely in the same manner as the manner in which power is supplied to the device plugged into the master outlet 10. The current to the device connected to master 10 is also supplied to gate 16 of Triac Q2 through resistor R2 which is also connected to one side of the master receptacle 10. As a result, a device plugged into slave receptacle 12 will be energized exactly as the device connected to master 10. The on-off switch of the device plugged into slave 12 is closed ("on") at all times but the device is energized only when the master is energized and then the manner of energization of the slave will be the same as the master.

Figure 2:
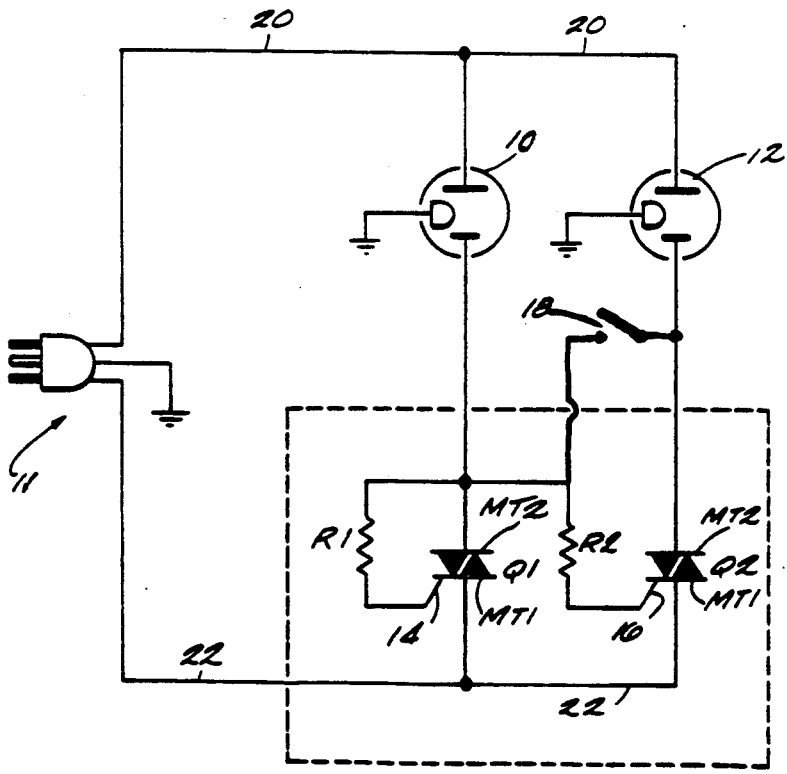
FIG. 2 adds switch 18 to the circuit shown in FIG. 1 to apply power to the slave receptacle 12 without power usage at receptacle 10.

When using a power saw a lot of dust is generated. If the saw is plugged into the master 10 and a shop vacuum is plugged into the slave receptacle 12 the vacuum will be energized whenever the saw is used. This reduces the dispersion of dust. When the saw is off the vacuum is off and there is no noise. The device functions as an interlock since the vacuum can't be energized without the saw ... unless the circuit is provided with the optional by-pass switch 18 shown in FIG. 2 connecting one side of the slave 12 to resistor R2 and trigger 16 of Q2. When switch 18 is closed the vacuum can be operated without running the saw.

In the normal mode, the current applied to the slave will follow the characteristics of the current at the master. Therefore, the slave will have Slow Start if the tool plugged into the master has that feature. Or the slave will follow speed controls and the like.

I claim:

1. A master/slave circuit comprising,
a master receptacle,
a slave receptacle,
power supply means including a plug and having a first and a second conductor, said first conductor being connected to one side of each receptacle,
first and second Triacs each including a gate and a "main terminal one" connected to said second conductor of said power supply cord and also including a "main terminal two",
said gate of said first Triac being connected to the other side of said master receptacle through a first resistor,
said gate of said second Triac being connected to said other side of said master receptacle through a second resistor,
said "main terminal two" of said first and second Triacs being connected to said master and slave receptacles respectively,
electric power consumption at said master receptacle being controlled by a device plugged into said master receptacle and the power characteristics of such consumption at said master receptacle being applied to the gate of said second Triac to cause such power characteristics to be supplied to said slave receptacle, and a switch operative when closed to connect the other side of said slave receptacle to said gate of said second Triac through said second resistor whereby a device connected to said second receptacle can be energized independently of the master receptacle.

* * * * *